United States Patent
Aoshima et al.

(10) Patent No.: US 7,133,703 B2
(45) Date of Patent: Nov. 7, 2006

(54) SMALL ELECTRONIC DEVICE HAVING BATTERY LEVEL DETECTION UNIT

(75) Inventors: Yoshinori Aoshima, Ibaraki (JP); Kazuhiko Daido, Moriya (JP)

(73) Assignee: Hitachi Maxell, Ltd., Osaka (JP)

( * ) Notice: Subject to any disclaimer, the term of this patent is extended or adjusted under 35 U.S.C. 154(b) by 244 days.

(21) Appl. No.: 10/802,751

(22) Filed: Mar. 18, 2004

(65) Prior Publication Data
US 2004/0185913 A1 Sep. 23, 2004

(30) Foreign Application Priority Data
Mar. 19, 2003 (JP) .............................. 2003-075069

(51) Int. Cl.
H04B 1/38 (2006.01)
H04M 1/00 (2006.01)

(52) U.S. Cl. ............... 455/574; 455/41.1; 455/41.2; 455/418; 455/550.1; 455/556.1; 455/572; 455/573; 320/112; 320/113; 320/114; 320/115; 713/340

(58) Field of Classification Search ............ 455/41.1, 455/41.2, 418, 550.1, 556.1, 556.2, 557, 455/572–574, 559, 551; 320/112–115; 713/340; 307/22, 35
See application file for complete search history.

(56) References Cited

U.S. PATENT DOCUMENTS

| | | | | |
|---|---|---|---|---|
| 5,774,793 A | * | 6/1998 | Cooper et al. ............. | 455/418 |
| 5,974,334 A | * | 10/1999 | Jones, Jr. ................. | 455/556.2 |
| 6,516,202 B1 | * | 2/2003 | Hawkins et al. .......... | 455/556.2 |
| 6,555,990 B1 | * | 4/2003 | Yang ........................ | 320/113 |
| 6,628,965 B1 | * | 9/2003 | LaRosa et al. ............. | 455/557 |
| 6,650,231 B1 | * | 11/2003 | Byrne ....................... | 340/407.1 |
| 6,678,538 B1 | * | 1/2004 | Koizumi .................... | 455/574 |
| 6,928,567 B1 | * | 8/2005 | Nakai ........................ | 713/340 |
| 2001/0039195 A1 | * | 11/2001 | Nickum ..................... | 455/557 |
| 2002/0012048 A1 | * | 1/2002 | Yamagishi ................. | 348/207 |
| 2002/0025839 A1 | * | 2/2002 | Usui ......................... | 455/574 |
| 2002/0107054 A1 | * | 8/2002 | Fujisawa et al. ............ | 455/573 |
| 2002/0198031 A1 | * | 12/2002 | Holmes et al. ............. | 455/569 |
| 2003/0013506 A1 | * | 1/2003 | Wang ........................ | 455/573 |
| 2003/0050102 A1 | * | 3/2003 | Roh .......................... | 455/573 |
| 2003/0069050 A1 | * | 4/2003 | Lin ........................... | 455/572 |
| 2003/0092468 A1 | * | 5/2003 | North ........................ | 455/556 |
| 2003/0119568 A1 | * | 6/2003 | Menard ..................... | 455/572 |
| 2004/0063464 A1 | * | 4/2004 | Akram et al. .............. | 455/559 |
| 2004/0203351 A1 | * | 10/2004 | Shearer et al. ............. | 455/41.1 |

* cited by examiner

Primary Examiner—Steve M. D'Agosta
(74) Attorney, Agent, or Firm—Birch, Stewart, Kolasch & Birch, LLP

(57) ABSTRACT

A small electronic device has a battery level detection unit for real-time detection of the current battery level and a communication unit for transmitting report data on a detected battery level to another small electronic device, such as a pocket PC device. The receiving small electronic device compares the data with data on its own battery level detected therein and displays the lower battery level data.

12 Claims, 5 Drawing Sheets

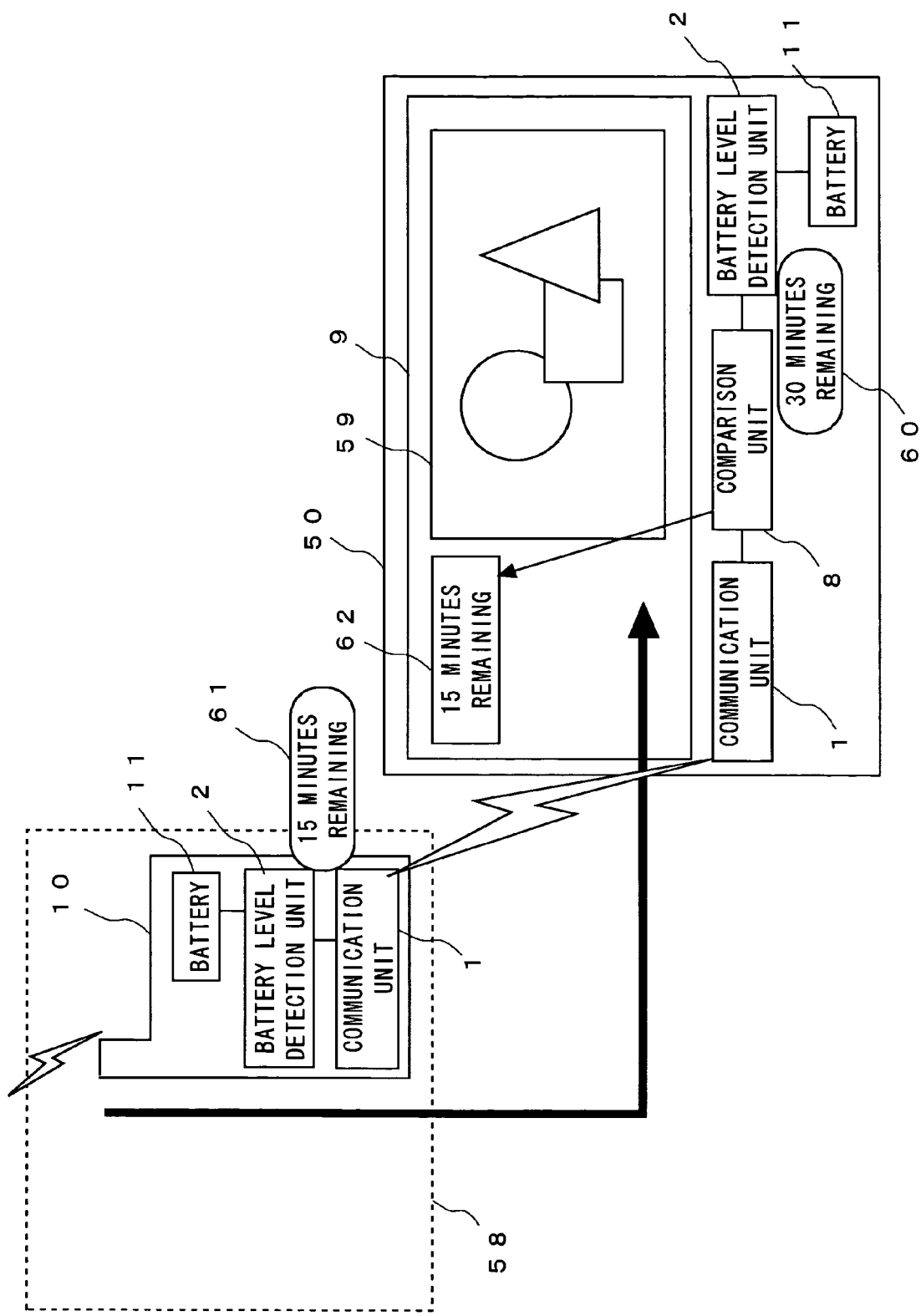

SMALL ELECTRONIC DEVICE HAVING BATTERY LEVEL DETECTION UNIT

CROSS-REFERENCE TO RELATED APPLICATION

The present invention is related to Japanese Patent Application Serial No. 2003-075069, which is hereby incorporated.

BACKGROUND OF THE INVENTION

1. Field of the Invention

The present invention relates to small portable electronic devices such as cellular phones and mobile information devices and, more particularly, to small portable electronic devices capable of detecting the charge level of a secondary battery contained therein.

2. Description of the Related Art

Conventional small electronic devices indicate a remaining battery level by detecting the voltage of a secondary battery serving as a power source and displaying the current battery charge at several levels according to the detected battery voltage on a display mounted thereon.

Cellular phones, however, are normally kept in a bag and the like when a user is not talking on the phone, and the display of the cellular phone is thus not checked frequently. Hence, when downloading music data and so on to a cellular phone, for example, it is likely that a user keeps the operation, which takes a long time, running without noticing a decrease in a battery. This leads to a battery shortage to interrupt the data communication before the user knows it.

SUMMARY OF THE INVENTION

In view of the foregoing, it is an object of the present invention to provide a small electronic device to be placed in a breast pocket and so on for frequent checking of its display, capable of communicating data with an external device such as a cellular phone and displaying information on the remaining battery level of the external device, thereby allowing a user to notice a battery shortage during data processing.

To these ends, according to one aspect of the present invention, there is provided a small electronic device including a battery; a battery level detection unit for detecting a charge level of the battery; a display unit for displaying various data; and a communication unit for exchanging data with an external device, wherein the small electronic device receives battery level data of the external device detected by the external device, compares the data with its own battery level data output from the battery level detection unit, and displays a comparison result on the display unit. The small electronic device having this structure allows a user to notice battery shortage during data processing in the external device.

In the above small electronic device, the comparison result is preferably lower battery level data selected from the battery level data of the external device and the battery level data of the small electronic device.

The small electronic device may be a portable PC device. The external device may be a cellular phone.

According to another aspect of the present invention, there is provided a small electronic device including a battery; a battery level detection unit for detecting a charge level of the battery; a display unit for displaying various data; and a communication unit for exchanging data with an external device, wherein the small electronic device receives operating time data of the external device calculated from a battery level detected by the external device, compares the data with its own operating time data calculated from a battery level output from the battery level detection unit, and displays a comparison result on the display unit. The small electronic device having this structure allows a user to notice battery shortage during data processing in the external device.

In the above small electronic device, the comparison result is preferably shorter operating time data selected from the operating time data of the external device and the operating time data of the small electronic device.

The small electronic device may be a portable PC device. The external device may be a cellular phone.

According to another aspect of the present invention, there is provided a monitoring method for monitoring a battery level, including the steps of detecting a battery level at a first small electronic device; transmitting battery level data from the first small electronic device; receiving the battery level data at a second small electronic device; detecting a battery level at the second small electronic device; comparing the battery level data of the first small electronic device with battery level data of the second small electronic device; and displaying a comparison result at the second small electronic device. This method allows a user to notice battery shortage during data processing in the small electronic device.

In the above monitoring method, the transmitting of the battery level data may be triggered by satisfying predetermined conditions. Alternatively, the transmitting of the battery level data may be triggered in response to a request from the second small electronic device.

The comparison result in the displaying step is preferably lower battery level data selected from the battery level data of the first small electronic device and the battery level data of the second small electronic device.

According to another aspect of the present invention, there is provided a monitoring method for monitoring a battery level, including the steps of detecting a battery level at a first small electronic device; calculating a operating time from the battery level at the first small electronic device; transmitting operating time data from the first small electronic device; receiving the operating time data at a second small electronic device; detecting a battery level at the second small electronic device; calculating a operating time from the battery level at the second electronic device; comparing the operating time data of the first small electronic device with operating time data of the second small electronic device; and displaying a comparison result at the second small electronic device. This method allows a user to notice battery shortage during data processing in the small electronic device.

In the above monitoring method, the transmitting of the operating time data may be triggered by satisfying predetermined conditions. Alternatively, the transmitting of the operating time data may be triggered in response to a request from the second small electronic device.

The comparison result in the displaying step is preferably shorter operating time data selected from the operating time data of the first small electronic device and the operating time data of the second small electronic device.

According to another aspect of the present invention, there is provided a battery housing attached to a small electronic device as a driving power source, including a battery; a battery level detection unit for detecting a charge level of the battery; and a communication unit for transmitting the charge level to an external device to display a comparison result between the charge level of the small electronic device and a charge level of the external device. The battery housing having this structure allows a user to notice battery shortage during data processing in the small electronic device.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

FIG. 6 is a schematic block diagram of a data processing system having a cellular phone and a PC device according to an embodiment of the present invention.

DESCRIPTION OF THE PREFERRED EMBODIMENTS

Figure 1:
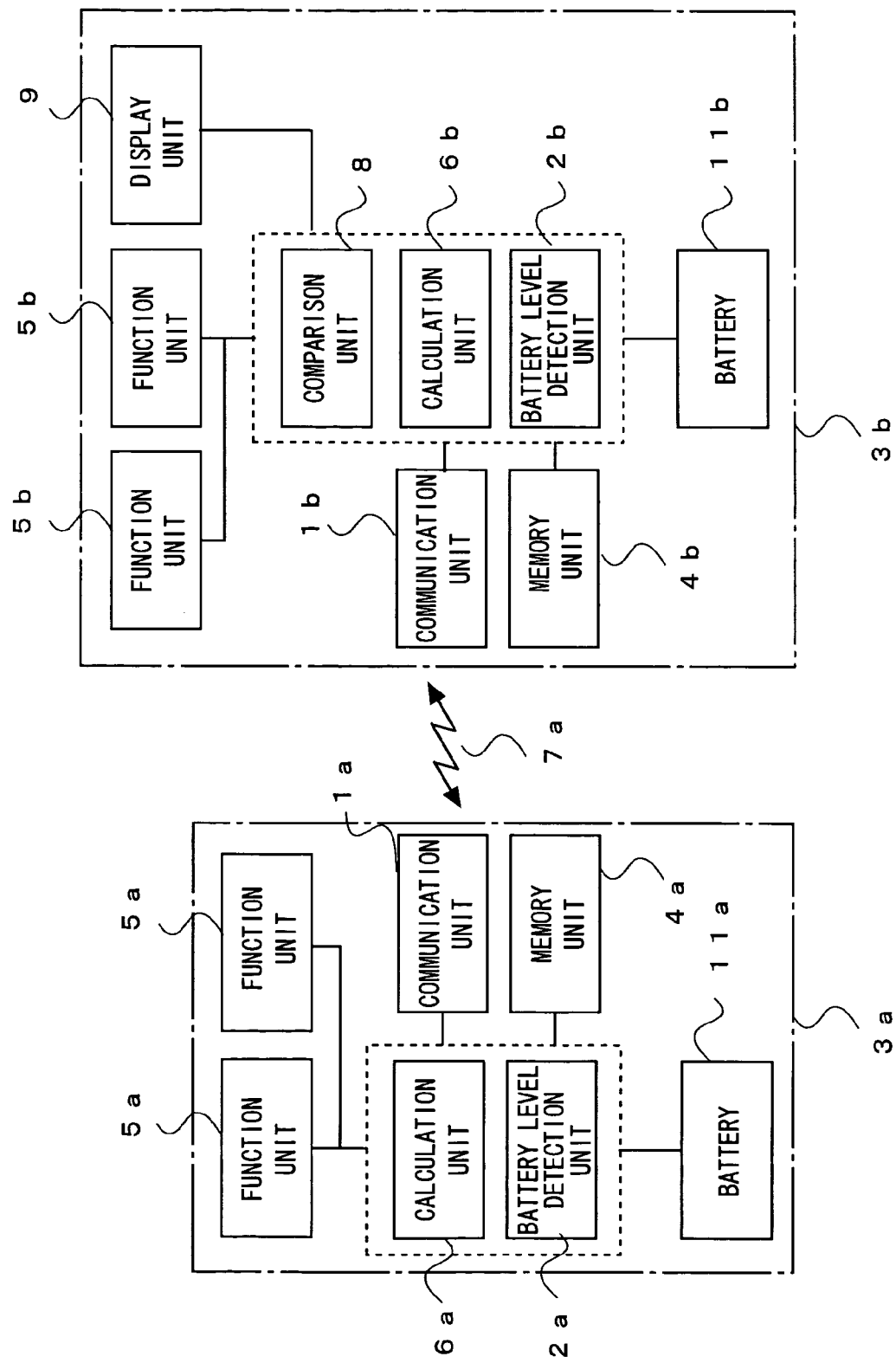
FIG. 1 is a schematic block diagram illustrating the basic structure of the present invention.

The basic structure of the present invention is shown in FIG. 1. A small electronic device 3a is typically a cellular phone. The small electronic device 3a includes a function unit 5a, such as data communication function as a cellular phone, that uses a battery 11a as a driving power source, a battery level detection unit 2a for detecting the remaining charge level of the battery 11a, and a communication unit 1a for exchanging data with another small electronic device 3b.

The small electronic device 3a detects a battery level by the battery level detection unit 2a and transmits report data 7 on the detected battery level to the small electronic device 3b by the communication unit 1a. The small electronic device 3b compares, by a comparison unit 8, the received report data 7 with its own battery level data detected by the battery level detection unit 2b, and displays the result on a display unit 9.

The report data 7 is data on a remaining battery level. The small electronic device 3b at the receiving end is a mobile information device capable of displaying the battery level, such as a pocket PC device.

The report data 7 may be transmitted to the small electronic device 3b automatically upon satisfying preset conditions, or, in response to a request from the small electronic device 3b.

A plurality of types of the function units 5 are provided in the small electronic device 3a and 3b. The small electronic device 3a and 3b may further have a calculation unit 6 for calculating the available driving time when driving each function unit 5 with the remaining charge of the battery 11 detected by the battery level detection unit 2, and transmit the report data 7 including the calculation result from the calculation unit 6 to another small electronic device through the communication unit 1.

Figure 2:
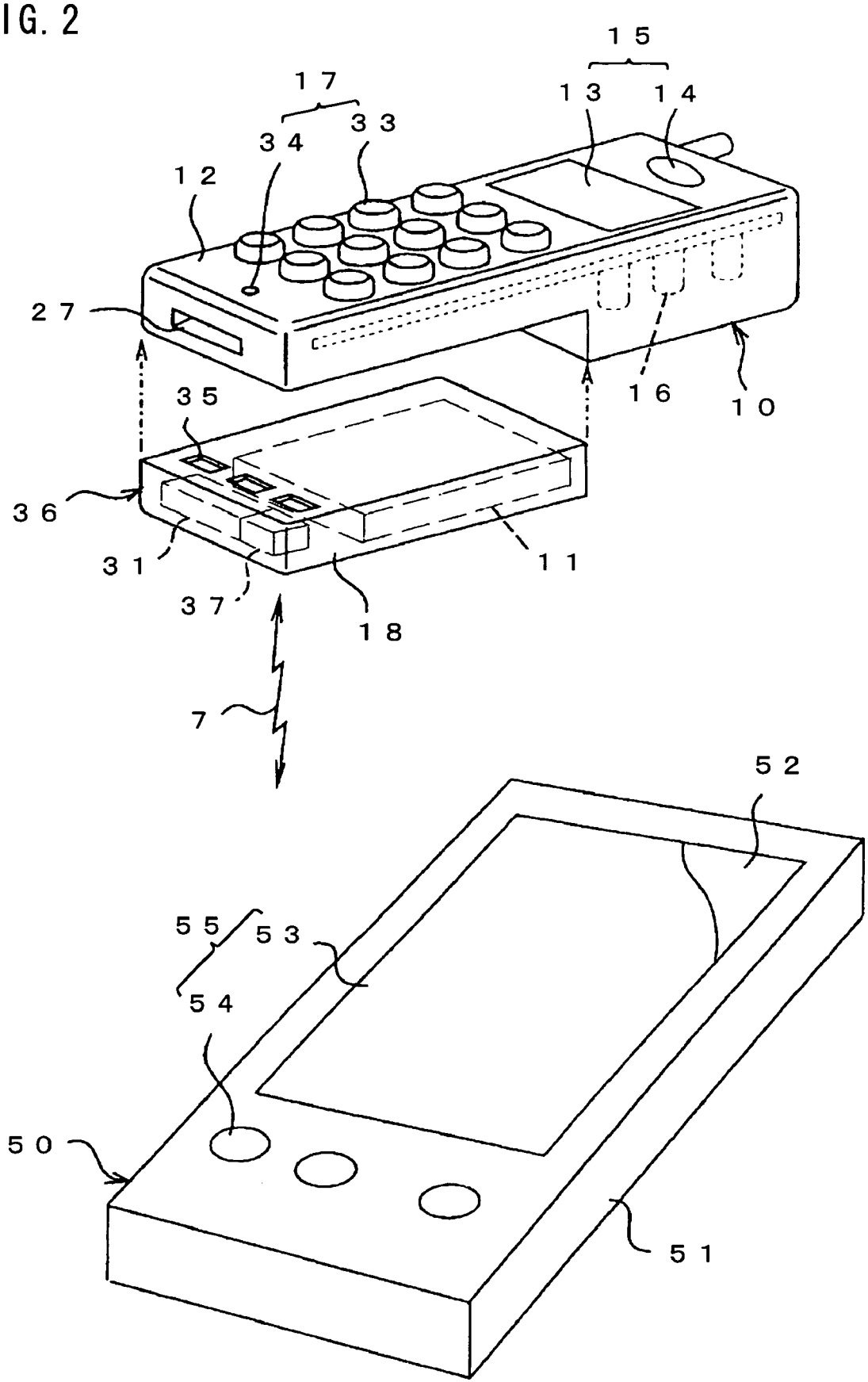
FIG. 2 is a perspective view illustrating an exemplary embodiment in which the present invention is applied to a data processing system having a cellular phone and a PC device.

It is also possible to provide a battery package 36, shown in FIG. 2, having a battery housing 18 containing the battery 11 and the communication unit 1. The battery package 36 can be attached to or detached from a main housing 12 of the small electronic device. The battery housing 18 may further contain the battery level detection unit 2 and a memory unit 4 for storing battery level data detected by the battery level detection unit 2. The battery level data is data on a remaining battery level output from the battery level detection unit 2, data on the available operation time of an external device calculated from the battery level, and so on.

Now, an embodiment in which the present invention is applied to a data processing system using a cellular phone 10 and a pocket PC device 50 as small electronic devices will be explained with reference to FIG. 2 to 4. The present invention, however, is not limited to this embodiment, and it may be applied also to various other small electronic devices using the battery 11 as a driving power source. In the embodiment explained below, the battery 11 is a secondary battery, which is rechargeable; however, it may be a primary battery, which is not rechargeable.

The cellular phone 10, as shown in FIG. 2 has a flat rectangular main housing 12. The front side of the main housing 12 has a display section 15 consisting of a display screen 13 comprising a liquid crystal display board and a speaker 14, and an operation section 17 consisting of a keyboard 33 and a microphone 34. A detachable battery package 36 having a battery housing 18 containing a secondary battery 11 is attached, by an electrode 35, to the back side of the main housing 12. Further, electronic circuits 16 are provided inside the main housing 12 and the battery housing 18.

The PC device 50, on the other hand, has a portable-sized rectangular main housing 51. The front side of the main housing 51 has a display section 52 comprising a liquid crystal display board, in its middle part. It also has an operation section 55 consisting of a touch panel 53 covering the display section 52 and a push-button switch 54 placed below the display section 51. Inside the main housing 51 is a control section 56 that operates with a micro processor. Since the structure of the PC device 50 is substantially the same as that of conventional PC devices, an explanation will be given only on differences between them and a detailed explanation on the circuit structure will be omitted.

Figure 3:
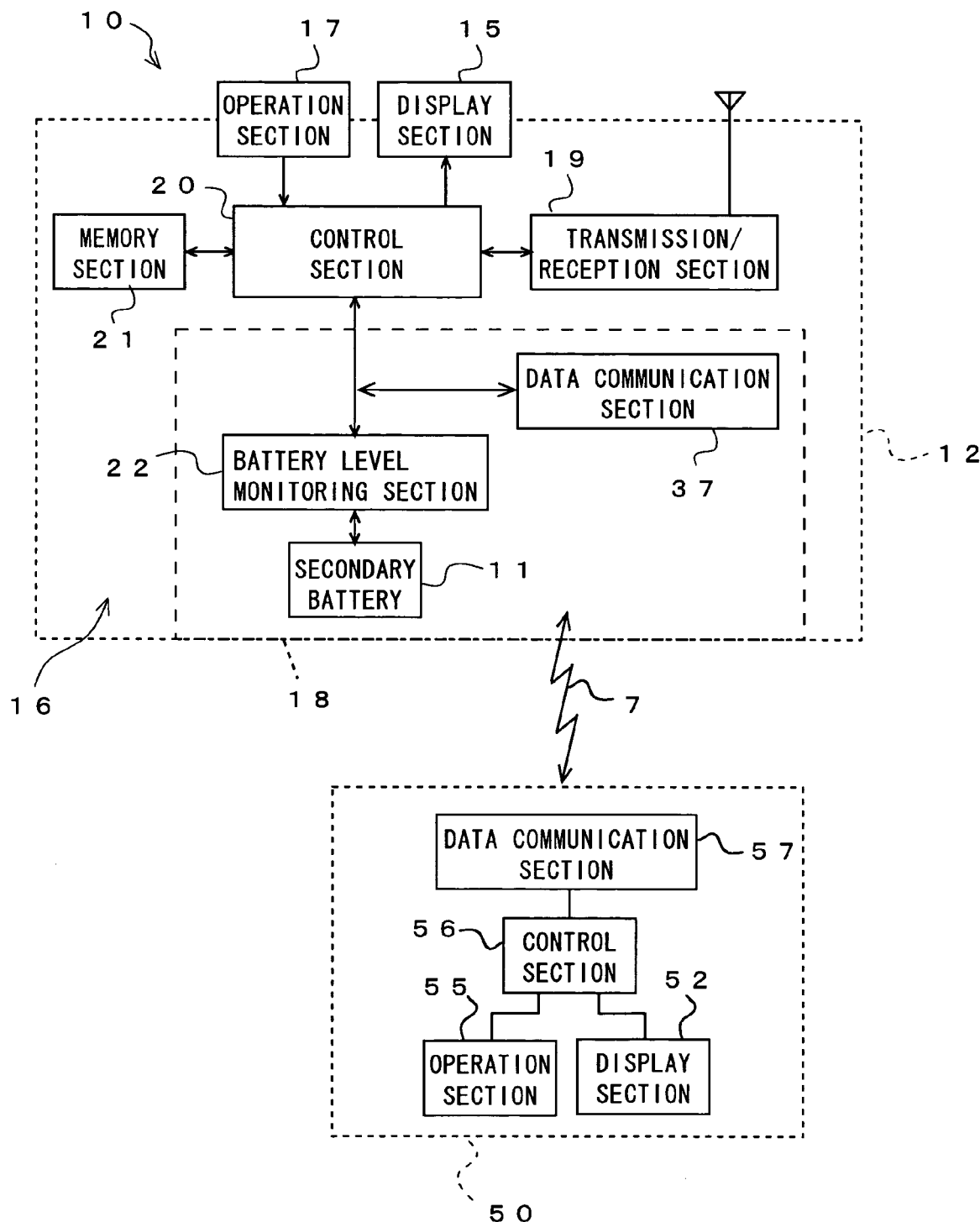
FIG. 3 is a schematic block diagram illustrating the structure of an electronic circuit according to an embodiment of the present invention.

FIG. 3 schematically illustrates the structure of the electronic circuit 16 contained in the cellular phone 10. The electronic circuit 16 includes a transmission/reception section 19 having basic transmit and receive functions as a cellular phone. It also includes a control section 20 having a one-chip microcomputer and a memory section 21 storing software, thereby performing a control operation to implement various functions described later. The basic circuit structure as a cellular phone is substantially the same as conventional multifunction phones; thus, a detailed explanation will be omitted.

In this embodiment, a battery level monitoring section 22 for monitoring the secondary battery 11 is placed in the battery housing 18 to provide real-time detection of the remaining charge level of the secondary battery 11. Based on the detected battery level data, various control operations, which will be described later, are performed.

Figure 4:
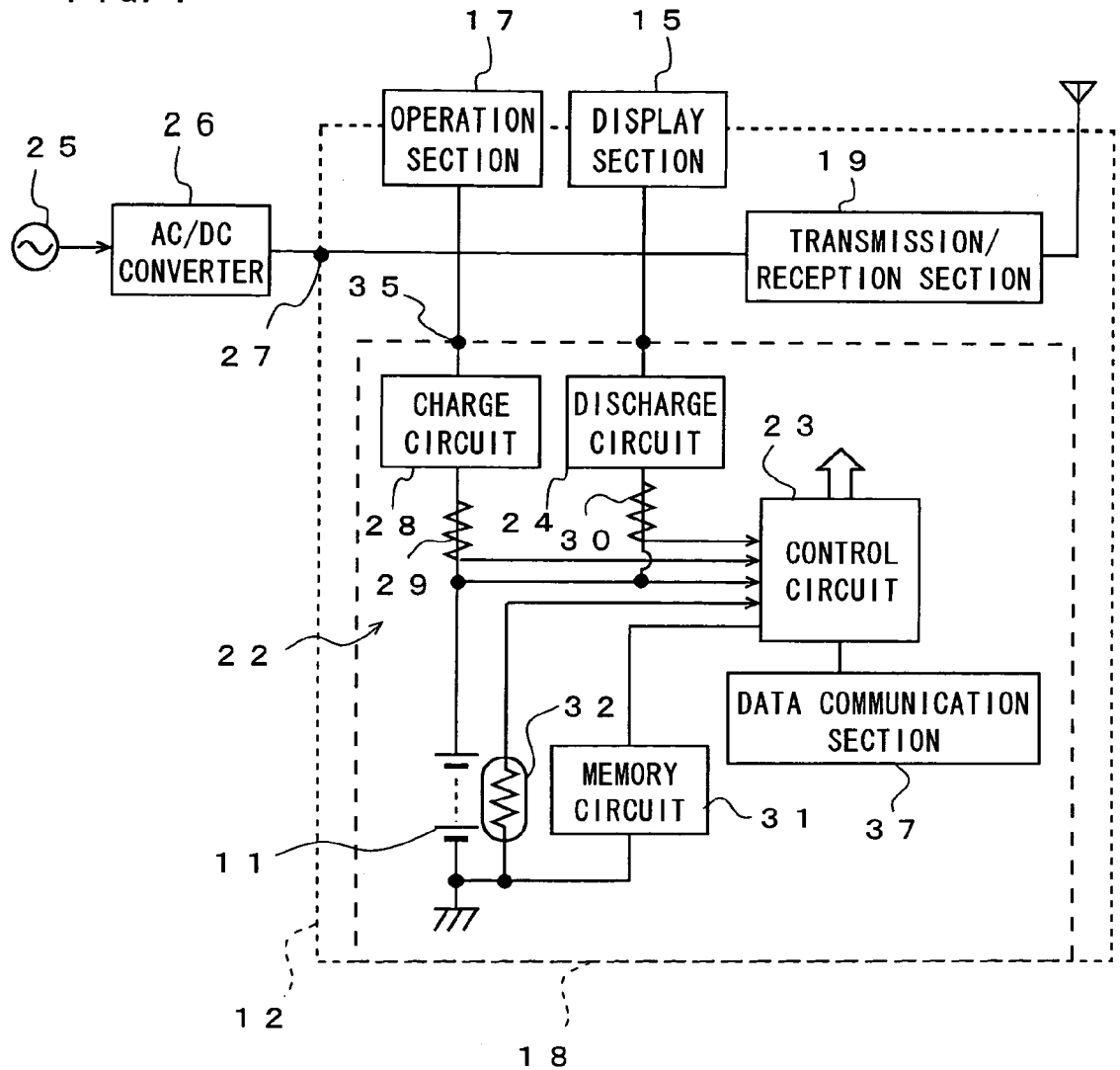
FIG. 4 is a block diagram illustrating the structure of a battery level monitoring section according to an embodiment of the present invention.

FIG. 4 is a block diagram illustrating the structure of the battery level monitoring section 22. It mainly shows the structure related to the charging and discharging of the secondary battery 11 in the battery housing 18. An output voltage from the secondary battery 11 is applied to each section through a discharge circuit 24 controlled by the control circuit 23. Thus, the electronic circuit 16 normally operates using the battery 11 as a driving power source.

A commercial AC power source 25 outputs a commercial AC voltage with 100 to 200 V. The AC voltage is converted to a low DC voltage by an AC/DC converter 26, and then applied to the electronic circuits 16 in the main housing 12 through a detachable connector 27 at the bottom of the main housing 12.

The DC voltage sent from outside of the main housing 12, instead of the secondary battery 11, can supply driving power to each section of the electronic circuit 16. A charge circuit 28, controlled by the control circuit 23, controls a charge voltage and a charge current applied to the secondary battery 11. It is thus possible to charge the secondary battery 11 to a given level, seeing the exact remaining charge level of the secondary battery 11 in conjunction with the discharge circuit 24.

The battery level monitoring section 22 has a charge current sensor 29 for detecting a charge current level in the charge circuit 28 and a discharge current sensor 30 for detecting a discharge current level in the discharge circuit 24. The battery level monitoring section 22 also has a control circuit 23 for controlling the entire operation of the battery level monitoring section 22 to control the charging and discharging of the secondary battery 11 based on a current level detected by the sensors 29 and 30. Further, by adding up the detected charge and discharge current levels, the current battery level can be calculated at real-time.

The battery level monitoring section 22 in this embodiment further includes a memory circuit 31 and a temperature sensor 32 contained in the battery housing 18. The calculated battery level is corrected based on battery characteristic data stored in the memory circuit 31 and battery surface temperature change data detected by the temperature sensor 32. The report data 7 on the remaining battery level is then stored in the memory circuit 31.

The memory circuit 31 comprises rewritable memory such as flash memory or RAM backed up with a battery. The memory circuit 31 has a minimum circuit structure necessary for data writing to and reading from the memory.

The memory circuit 31 stores battery characteristics data required for calculating charge and discharge levels, such as load characteristics, temperature characteristics, and degradation characteristics of a unit cell of the secondary battery 11. It also stores the report data 7 required for estimating changes in a remaining battery level not only while charging and discharging, but also after detaching the battery housing 18 from the main housing 12, such as a battery level during charging and discharging and its time. The structure of the memory circuit 31 and the data stored therein, however, are not limited thereto.

The control circuit 23 stores an algorithm for detecting a remaining battery level. The algorithm performs absolute correction of a battery level to 0% at a full-discharge level in which a battery voltage falls below a lower limit, and to 100% at a full-charge level. Battery levels between them are calculated by adding up the charge and discharge levels. There are various ways to detect a remaining battery level.

For example, a battery level may be determined to be a full-charge level when the time rate of change of a battery temperature exceeds a set level, when a battery voltage takes a downward turn and decreases by a predetermined amount or more, or when the second derivative of a battery voltage with respect to time turns from positive to negative in the region close to 100% charge level. An algorithm suitable for the system is used.

Further, the detection of a full-charge state and the add-up of charge and discharge levels are operated in accordance with the secondary battery 11 in use, using the battery characteristics data stored in the memory circuit 31 in the battery housing 18. The calculated battery level and its time are always stored in the memory circuit 31. If the battery housing 18 is temporarily removed from the main housing 12 and then attached back thereto, a self-discharge level is estimated from a time period during which the battery is separated and the discharge characteristics of the battery. The self-discharge level is then subtracted from the battery level before the removal of the battery housing 18, thereby correcting the current battery level.

Further, in this embodiment, the cellular phone 10 and the PC device 50 have general-purpose data communication sections 37 and 57, respectively, for enabling short-distance wireless data communication, such as Bluetooth, which is the name of a wireless protocol standard, created by Ericsson, as shown in FIG. 3. This allows the cellular phone 10 and the PC device 50 to exchange data with each other.

It is thereby possible to transmit given data according to the data input from the operation section 55 from the PC device 50 to the cellular phone 10 by the data communication section 57. It is also possible to transmit the report data 7 from the cellular phone 10 to the PC device 50 by the data communication section 37 and display a screen corresponding to the report data 7 on a liquid crystal screen on the display section 52 of the PC device.

For example, the report data 7 on the current charge level of the secondary battery 11 may be transmitted from the cellular phone 10 to the PC device 50 mandatorily by sending a request for the report data 7 from the PC device 50 to the cellular phone 10, or, automatically upon satisfying given conditions such as a battery level falling below a set level.

Receiving the report data 7, the PC device 50 compares the charge level of the secondary battery 11 in the cellular phone 10 with that of the secondary battery 11 in the PC device 50, and displays the lower battery level data on the display section 52. Further, if the PC device 50 determines the battery level to be low, it automatically performs necessary operations such as data storing, and displays an alert message corresponding to a remaining battery level on the display section 52. The compared or displayed battery level data may be battery charge data in % or mAh, or the operation time of the cellular phone 10 or the PC device 50 in minutes or hours.

Displaying both the charge level of the secondary battery 11 in the cellular phone 10 and that of the secondary battery 11 in the PC device 50 in a bar chart, a pie chart, digital data and so on allows a user to check relative remaining battery levels and remaining operating time.

FIG. 6 schematically shows an embodiment of a data processing system made up of the cellular phone 10 and the PC device 50 according to the present invention. The cellular phone 10 is on mobile communication, which is its original function. The cellular phone 10, placed in a bag, and the PC device 50 are connected by their communication units 1, and the PC device 50 operates with the mobile communication function of the cellular phone 10. The operation process is displayed as an operation screen 59 on the display unit 9 of the PC device 50.

Now, the battery level detection unit 2 in the PC Device 50 determines remaining operating time of the PC Device 50 to be 30 minutes from the charge level of the battery 11 in the PC device 50 and the power consumption of the PC device 50. The battery level detection unit 2 in the cellular phone 10, on the other hand, determines remaining operating time of the cellular phone 10 to be 15 minutes from the charge level of the battery 11 in the cellular phone 10 and the power consumption of the cellular phone 10.

Normally, the remaining battery level of the PC device 50 is displayed on the screen. Thus, the PC device 50 displays the screen indicating 30 minutes remaining. However, since the remaining operating time is shorter in the cellular phone 10, if the current operation is kept running, the mobile communication is disconnected during the operation due to the run-out of the battery 11 of the cellular phone 10; consequently, the operation of the PC device 50 is also interrupted.

To avoid this, the PC device 50 requests the cellular phone 10 for data on the remaining charge level of the battery 11 to obtain remaining battery level data 61 of the cellular phone 10. Alternatively, the cellular phone 10 may automatically transmit the battery level data to the PC device 50 at regular time intervals. The comparison unit 8 in the PC device 50 compares the remaining battery level data 61 of the cellular phone 10 with remaining battery level data 60 of the PC device 50. The lower battery level data is displayed on the display unit 9 of the PC device 50.

In this way, an operator of the PC device 50 is informed of, besides the remaining operating time of the PC device 50, the remaining operating time of the current processing in the cellular phone 10. This prevents abrupt end of transmission or reception of important data and enables secure data communication. This also prevents the problem that a user fails to obtain data despite they have paid for the data due to interruption of the charged data retrieval.

Besides the basic calling function as a normal cellular phone, the cellular phone 10 may have the following functions implemented by software: a function for retrieving data via internet, a function for downloading various data including music, video, and program to the memory section 21, a function for executing the downloaded data in the memory section 21, and a function for commercial activities including purchasing and banking. The functions of the cellular phone 10, however, are not limited thereto.

As explained above, the cellular phone 10 has, besides basic function such as receipt of calls and telephone calls by voice, additional functions such as data communication via internet, data downloading, music recording and reproduction, video recording and reproduction, execution of program such as games. Since an active part of the circuit, CPU utilization and so on vary by function, the amount of power required per unit time to execute a selected function varies accordingly.

If a function to be used is specified, the amount of power required per unit time is determined, and time for executing this function is estimated from a battery level remained. In case of music or video recording and reproduction, a unit time such as a track is estimated, and, in case of data downloading, time for downloading is estimated from a transmission speed and the number of bytes of the data.

Figure 5:
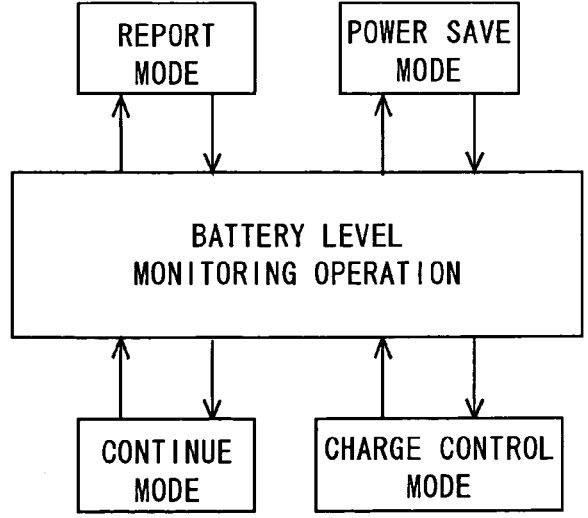
FIG. 5 is an explanatory diagram illustrating operation modes performed using a battery level monitoring section according to an embodiment of the present invention.

Hence, when executing the above functions, the cellular phone 10 manually or automatically executes the operation of the following modes in conjunction with the remaining charge level of the battery 11 detected by the battery level monitoring section 22 as shown in FIG. 5. The following modes may be implemented separately or simultaneously.

The first mode is a report mode that reports how long the selected function can be executed with the current battery level. In case of music or video reproduction, the display may show not only the available operating time but also immediately recognizable data such as the available number of tracks. If a remaining battery level allows executing only a part of the unit data, an alert message is also displayed.

The second mode is a power save mode that, if the battery level is too low to complete the function, saves power by stopping or reducing the capacity of the functions in the reverse order of importance to execute the selected function.

For example, image display on the display section 15 is unnecessary during music reproduction or downloading. Thus, unnecessary operations such as backlight of the liquid crystal board are stopped or decreased in their functional capacity in the reverse order of importance so as to save power consumption, thereby extending the available operating time.

The third mode is a continue mode that, if the operation stops before completing the minimum unit of the selected function due to power shortage, resumes the operation from the interrupted point after replacing or charging the secondary battery 11.

For example, if interruption occurs during data download, this mode does not download all the data over again but downloads the rest of the data and couples it to the already downloaded data.

The fourth mode is a charge control mode that, if it is determined by the report mode that the remaining level of the secondary battery 11 is insufficient for completing the operation of the selected function, controls the charging in accordance with an additional battery level required for executing the function when going out and so on.

Besides displaying the battery level and so on, the handy PC device 50 may serve as a remote control terminal when the cellular phone 10 is placed separately, kept in a bag and so on. In this case, the PC device 50 displays an operation screen corresponding to each operation mode on the display section 52 and remote-controls the cellular phone 10 by the operation section 55. The PC device 50 may also receive data indicating the operational status of the cellular phone 10 including the current battery level and displays the data on the display section 52.

The remote-control function is particularly effective when the small electronic device has no or small display section, such as a CD player. Though the illustrations show the case of connecting two small electronic devices, it is also possible to use more than two small electronic devices, communicating data there among for a given data processing task.

As described in the foregoing, the present invention provides a small electronic device to be placed in a breast pocket and so on for frequent checking of its display, such as a PC device, capable of communicating data with an external device, such as a cellular phone. The small electronic device compares the battery level data of its own with the battery level data of the external device and displays the comparison result. This system allows a user to notice battery shortage during data processing in the external small electronic device and provide an appropriate response.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A small electronic device comprising:
   a battery;

a battery level detection unit for detecting a charge level of the battery;

a display unit for displaying various data; and a communication unit for exchanging data with an external device; and a comparison unit for comparing a battery level data of the external device detected by external device with its own battery level data output from the battery level detection unit, wherein the small electronic device displays a comparison result on the display unit, said comparison result comprising lower battery level data selected from the battery level data of the external device and the battery level data of the small electronic device.

2. The small electronic device according to claim 1, wherein the small electronic device is a portable PC device.

3. The small electronic device according to claim 1, wherein the external device is a cellular phone.

4. A small electronic device comprising:

a battery;

a battery level detection unit for detecting a charge level of the battery;

a display unit for displaying various data; and a communication unit for exchanging data with an external device; and a comparison unit for comparing a operating time data of the external device calculated from a battery level of the external device detected by the external device with its own operating time data calculated from a battery level output from the battery level detection unit, wherein the small electronic device displays a comparison result on the display unit, said comparison result comprises shorter operating time data selected from the operating time data of the external device and the operating time data of the small electronic device.

5. The small electronic device according to claim 4, wherein the small electronic device is a portable PC device.

6. The small electronic device according to claim 4, wherein the external device is a cellular phone.

7. A monitoring method for monitoring a battery level, comprising the steps of:

detecting a battery level at a first small electronic device;

transmitting battery level data from the first small electronic device;

receiving the battery level data at a second small electronic device;

detecting a battery level at the second small electronic device;

comparing the battery level data of the first small electronic device with battery level data of the second small electronic device; and displaying a comparison result at the second small electronic device, wherein the transmitting of the battery level data is triggered in response to a request from the second small electronic device.

8. The monitoring method according to claim 7, wherein the comparison result in the displaying step comprises lower battery level data selected from the battery level data of the first small electronic device and the battery level data of the second small electronic device.

9. A monitoring method for monitoring a battery level, comprising the steps of:

detecting a battery level at a first small electronic device;

calculating an operating time from the battery level at the first small electronic device;

transmitting operating time data from the first small electronic device;

receiving the operating time data at a second small electronic device;

detecting a battery level at the second small electronic device;

calculating an operating time from the battery level at the second electronic device;

comparing the operating time data of the first small electronic device with operating time data of the second small electronic device; and displaying a comparison result at the second small electronic device, wherein the transmitting of the operating time data is triggered in response to a reciuest from the second small electronic device.

10. The monitoring method according to claim 9, wherein the transmitting of the operating time data is triggered by satisfying predetermined conditions.

11. A monitoring method for monitoring a battery level, comprising the steps of:

detecting a battery level at a first small electronic device;

transmitting battery level data from the first small electronic device;

receiving the battery level data at a second small electronic device;

detecting a battery level at the second small electronic device;

comparing the battery level data of the first small electronic device with battery level data of the second small electronic device; and displaying a comparison result at the second small electronic device, wherein the comparison result in the displaying step comprises lower battery level data selected from the battery level data of the first small electronic device and the battery level data of the second small electronic device.

12. A monitoring method for monitoring a battery level, comprising the steps of:

detecting a battery level at a first small electronic device;

calculating an operating time from the battery level at the first small electronic device;

transmitting operating time data from the first small electronic device;

receiving the operating time data at a second small electronic device;

detecting a battery level at the second small electronic device;

calculating an operating time from the battery level at the second electronic device;

comparing the operating time data of the first small electronic device with operating time data of the second small electronic device; and displaying a comparison result at the second small electronic device, wherein the comparison result in the displaying step comprises shorter operating time data selected from the operating time data of the first small electronic device and the operating time data of the second small electronic device.

* * * * *